United States Patent [19]

Janssen

[11] Patent Number: 4,874,217

[45] Date of Patent: Oct. 17, 1989

[54] LIGHT SOURCE AND DETECTOR PACKAGES

[75] Inventor: Adrian P. Janssen, Exeter, Great Britain

[73] Assignee: STC PLC, London, England

[21] Appl. No.: 179,395

[22] Filed: Apr. 8, 1988

[30] Foreign Application Priority Data

Apr. 21, 1987 [GB] United Kingdom ............... 8709315

[51] Int. Cl.⁴ .............................................. G02B 6/42
[52] U.S. Cl. .............................. 350/96.20; 350/96.15
[58] Field of Search ............... 350/96.15, 96.17, 96.20; 250/227, 552; 857/17, 19, 30, 74, 80

[56] References Cited

U.S. PATENT DOCUMENTS

| | | | |
|---|---|---|---|
| 4,296,998 | 10/1981 | Duftt | 350/96.20 |
| 4,439,006 | 3/1984 | Stevenson | 350/96.20 |
| 4,479,698 | 10/1984 | Landis et al. | 350/96.20 |
| 4,500,165 | 2/1985 | Scholl et al. | 350/96.20 |
| 4,615,031 | 9/1986 | Eales et al. | 350/96.20 X |
| 4,623,220 | 11/1986 | Grabbe et al. | 350/96.20 |
| 4,627,687 | 12/1986 | Dorn et al. | 350/96.20 |
| 4,756,592 | 7/1988 | Sasayama et al. | 350/96.20 |

FOREIGN PATENT DOCUMENTS 2124402 2/1984 United Kingdom .

Primary Examiner—John D. Lee
Assistant Examiner—Phan T. Heartney
Attorney, Agent, or Firm—Lee, Mann, Smith, McWilliams & Sweeney

[57] ABSTRACT

A laser chip is mounted on a cantilevered extension of the fibre support tube so it is immune to misalignment forces from the package. Also enables testing prior to packaging.

5 Claims, 1 Drawing Sheet

LIGHT SOURCE AND DETECTOR PACKAGES

BACKGROUND OF THE INVENTION (1) Field of the invention

This invention relates to semiconductor light sources and detectors and particularly to packaging these devices.

A semiconductor light source or detector comprises a semiconductor chip which is coupled for light transfer communication between an optical fibre tail within the package.

(2) Discussion of the prior art

One example of a packaged semiconductor optical transmission device is disclosed in our published British Pat. No. 2124402 in which FIG. 7 of that patent shows in detail how the optical fibre tail end 60 is secured in relation to the semiconductor chip 31 on a mount 30. A modified arrangement is shown in FIG. 8. In both arrangements the chip and the fibre end are secured to the mount 30 which in turn is secured either directly to the base of the casing 10 or via a Peltier thermo-electric heat pump 129.

It is imporant that the optical axis of the semiconductor chip is aligned with the optical axis of the optical fibre tail and that alignment is maintained throughout the working life of the device. Otherwise only a proportion of the light emanating from the chip or the fibre, depending on whether the device is a source or a detector, will be coupled into the fibre or into the chip, respectively. Clearly therefore it is important that the mounting arrangement within the package for the semiconductor chip is such that maximum coupling can be achieved during manufacture and that coupling remains unaltered through out the life of the device.

We have found that despite the precautions taken in the construction and manufacture of the device just described, nevertheless misalignment of the chip with respect to the fibre can still occur through distortion of the package, either mechanical forces on the package or alternatively thermal stresses.

It is an object of the present invention to provide a package in which misalignment is less likely to occur and which is also significantly cheaper to produce.

SUMMARY OF THE INVENTION

According to the present invention there is provided a semiconductor optical transmission device comprising: a source or detector; an optical fibre optically coupled to the source or detector, a cantilever support structure coextensive with and supporting the fibre, said source or detector being mounted on the free end of said cantilever structure.

BRIEF DESCRIPTION OF THE DRAWINGS

In order that the invention can be clearly understood reference will now be made to the accompanying drawings in which.

DESCRIPTION OF THE PREFERRED EMBODIMENT

Figure 1:
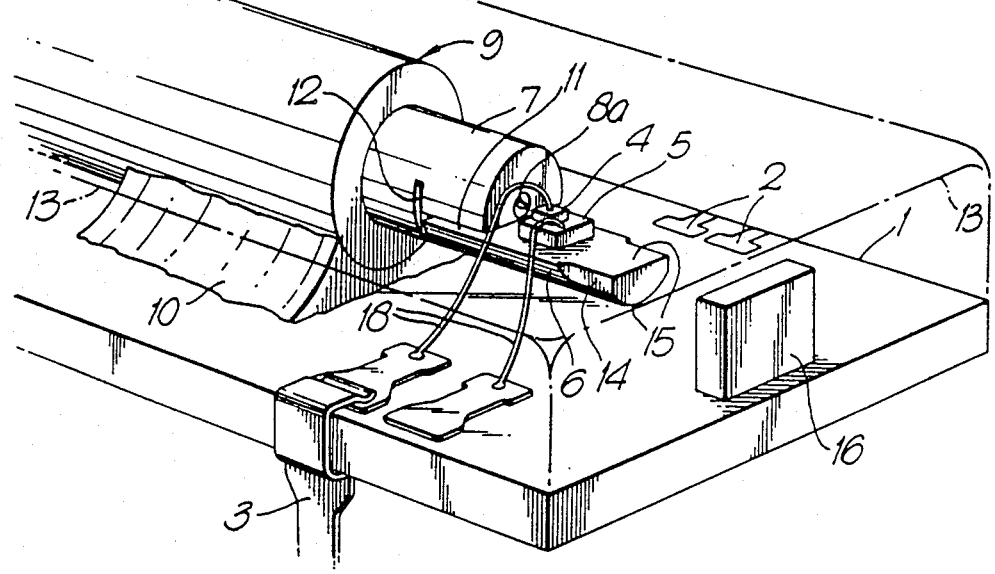
FIG. 1 is a perspective view of an optical transmission package constructed in accordance with an embodiment of the present invention.

Referring to FIG. 1 of the drawings an electrically insulated, rigid substrate 1 of for example ceramic material, carries contact pads such as 2. Secured to the substrate 1 are terminal posts such as 3 which are mechanically secured to the edge of the substrate 1 and are in electrical contact with respective electrical contact pads 2. These terminal posts enable external connection to the optical semiconductor package to be made.

In this embodiment, which is an injection laser package, an electro-optic component in the form of a semiconductor laser chip 4 is mounted on a pedestal which in turn is mounted on a ledge 6 which has a near semi-circular cross-section and has been cut from an end of a hypodermic tube 7. Housed in the tube 7 is an optical fibre 8 which is secured inside the tube 7 (see FIG. 2), and has an end 8a with an integral lens.

An outer tube 9 is secured to the hypodermic tube 7 and is secured for example by a solder fillet 10 to the substrate.

Between the ledge 6 and the end of the tube 7 containing the fibre 8 is an undercut region 11 and there is a further cross cut region 12 transverse to the undercut region 11. The arrangement would be provided with a hollow housing sealed to the substrate 1 and around the tube 9, as indicated by the broken lines 13.

The arrangement described isolates the electro-optic component from the package because the electro-optic component is not supported by the package but rather by the ledge 6, the intermediate fibre support tube 7 and sleeve 9, which together form a cantilever support structure for the fibre end 8a and the chip 4. Any movement of the cantilever support structure with respect to the package causes corresponding movement of the chip 4 and the fibre end 8a because the fibre support tube 7 carries the component and fibre end with it. The opto-electronic component is only electrically connected to the substrate via the flying gold wires which are sufficiently thin and malleable so as not to exert any material force on the component.

The hypodermic tube 7 is made of a metal which is malleable and in this example it is nickel and about 1 mm diameter. Nickel is easy to plate and to solder. The optical fibre 8 is stripped of its primary and secondary coatings over an end portin P1, and metallised with chromium, copper and gold by evaporation or sputtering techniques.

Figure 2:
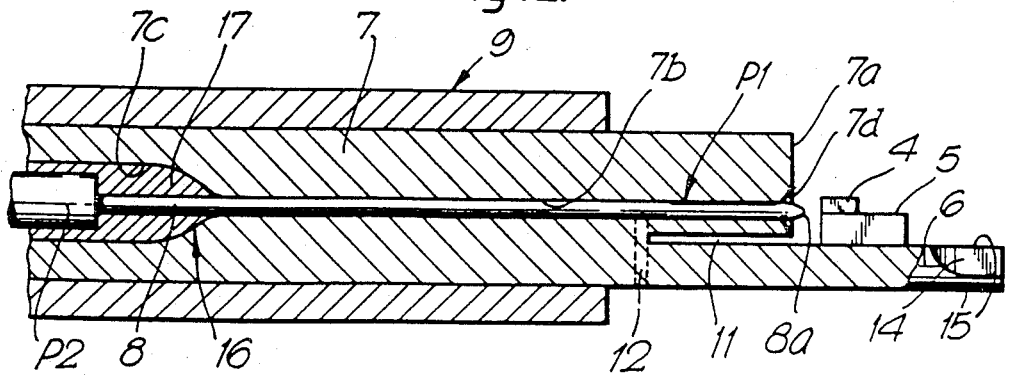
FIG. 2 shows a detail of FIG. 1.

The tube 7 with bore 7b is machined to provide the undercut region 11 and crosscut region 12 and also an enlarged bore portion 7c as shown more clearly in FIG. 2. In FIG. 2 the tube 7 has a bore 7b sized to be a sliding fit over the bare fibre 8. The bore widens at 16 to accommodate the unstripped portion P2 of the fibre.

The fibre 8 is secured in the bore 7b by solder as follows. The end of the bore 7b is countersunk at 7d and with the fibre in position a pellet of solder is placed in the countersunk region 7d and forms a meniscus when softened and fills the gap between the bore 7b and the metallised fibre portion P1 at least near the free end face 7a of the tube. The end of the fibre 8 has a lens 8a which is provided on the fibre. The remaining portion of unstripped fibre P2 lies in the enlarged bore 7c and is backfilled with epoxy resin 17.

The tube 7 is machined to have the undercuts and crosscuts 11 and 12 and the ledge 6 before the fibre is secured in the tube. It could also have the pedestal 5 machined from the tube rather than secured on to the ledge as a separate part. In the present proposal the pedestal 5 is mainly of diamond. One of the requirements is to have a good heat sink down the tube from the chip 4 (if it is a laser chip which produces a significant amount of heat) and through the outer tube 9 to the substrate 1.

Control of the laser using conventionally a monitor photodiode 16 may be achieved with the monitor photodiode also mounted on the ledge 6 behind the laser, or alternatively attached directly to the substrate 1 (as shown FIG. 1).

After the fibre is secured in the tube 7 with the pedestal 5, the chip is secured on the pedestal 5 with solder using a microscope and a positioning grating in order that the laser chip 4 is in the right position to within about 20 microns, i.e. a coarse adjustment. Once it is secured in approximately the right position, the height being provided by the machining of the parts, the final alignment is achieved by distortion of the ledge 6, facilitated by the undercut 11 and crosscut 12, while the chip is energised, to achieve maximum power output. Distortion of the ledge 6 to attain optimum chip position within 0.2 microns is achieved by a set of micro-positioning clamps which are able to push against the side faces 14 of the ledge 6 to give lateral displacement, and an alternative set of micro-positioning clamps pushing against top and bottom faces 15 of the ledge. Small changes in set position are made by distorting the ledge beyond its elastic limit which may be done in any appropriate direction until alignment is achieved. One electrical contact of the laser is achieved through the tube 7, pedestal 5, others via the gold flying leads 18.

The outer support tube 9 which could also be of nickel is then soldered to the tube 7 and the tube 9 then soldered at 10 to the substrate 1.

The package is completed with the lid 13 hermetically sealed to the substrate 1 and tube 9 to form a housing for the free end of the cantilever support structure and the laser chip.

There would however be other possible packaging arrangements using the fibre 8, tube 7 and aligned chip 4 as a basic sub-assembly, and in which the tube 7 is used as a cantilever support structure.

The fibre can be monomode or multimode. The lens could instead be a separate part secured to the laser chip or between the chip and the fibre end.

The undercut 11 is about 2 mm long and the ledge 6 projects about 1 mm out from the face 7a. The further crosscut 12 may be necessary to ease the distortion of the ledge 6 to achieve the desired alignment.

What is claimed is:

1. A semiconductor optical transmission device comprising: a substrate; a source or detector; an optical fibre optically coupled to the source or detector; a cantilever support structure coextensive with and supporting the fibre; said source or detector being mounted on the free end of said cantilever structure; said structure being cantilevered from said substrate.

2. A device as claimed in claim 1, wherein said cantilever structure comprises a tube.

3. A device as claimed in claim 1, wherein the optical fibre has an end adjacent to but spaced from the source or detector and the source or detector is mounted on a ledge of said structure projecting away from the fibre end, and said ledge is permanently distorted relative to said structure whereby to achieve accurate optical alignment of the source or detector with the fibre.

4. A device as claimed in claim 3, comprising at least one cut in said structure where said ledge projects to weaken the structure to ease said distortion.

5. A device as claimed in claim 1, comprising a rigid casing, including said substrate an aperture for said cantilever support structure in a wall of said casing, said structure being rigidly secured through the wall of said casing via said aperture so that said free end of said cantilever structure is housed within said casing.

* * * * *